United States Patent [19]
Lebesch

[11] Patent Number: 5,111,149
[45] Date of Patent: May 5, 1992

[54] METHOD AND APPARATUS FOR AUTOMATICALLY CALCULATING THE INTEGRITY OF AN ELECTRICAL COIL

[75] Inventor: Jeffrey D. Lebesch, Fort Collins, Colo.

[73] Assignee: Baker Electrical Instrument Company, Fort Collins, Colo.

[21] Appl. No.: 317,274

[22] Filed: Feb. 28, 1989

[51] Int. Cl.$^5$ .................. G01R 31/02; G01R 31/06
[52] U.S. Cl. .................. 324/546; 324/547; 364/486; 364/487
[58] Field of Search .................. 324/55, 546, 545, 547, 324/654, 655; 361/35; 364/482, 483, 486, 487

[56] References Cited

U.S. PATENT DOCUMENTS

| | | | |
|---|---|---|---|
| 3,281,674 | 10/1966 | Landgraf | 324/52 |
| 3,328,683 | 6/1967 | Davenport et al. | 324/51 |
| 3,508,143 | 4/1970 | Kuroda | 324/54 |
| 3,526,830 | 9/1970 | Azuma | 324/51 |
| 3,659,197 | 4/1972 | Alley et al. | 324/51 |
| 3,731,185 | 5/1973 | Pittman | 324/54 |
| 3,742,349 | 6/1973 | Richardson | 324/54 |
| 3,753,087 | 8/1973 | Tan | 324/546 X |
| 3,869,664 | 3/1975 | Safer et al. | 324/51 |
| 3,887,866 | 6/1975 | Safer et al. | 324/51 |
| 3,887,867 | 6/1975 | Safer et al. | 324/51 |
| 3,932,806 | 1/1976 | Kawada | 324/51 |
| 4,287,547 | 9/1981 | Vitins | 361/82 |
| 4,694,402 | 9/1987 | McEachern et al. | 364/487 |
| 4,746,869 | 5/1988 | Schrag et al. | 324/546 |

OTHER PUBLICATIONS

ECG Co., Ltd., ECG Advanced Impulse Winding Tester, Jun.-Sep., 1986.
Author: P. A. Sanghavi et al., Title: "Turn-to-turn testing improves coil life", pp. 44, 45; date: Dec. 1972.
Author: R. Malewski et al., Title: "Impulse testing of power transformers using the transfer function method", pp. 476-489; Apr. 1988.
Author: R. LaFevre, Title: "Test methods for electrical windings and their applications in the field", pp. 12-16; Jun. 1-5, 1987.
Author: D. M. Santos et al., Title: "Industrial applications of Mini, Micro & Personal Computers", pp. 870-872; Sep. 29-Oct. 3, 1986.

*Primary Examiner*—Jack B. Harvey
*Attorney, Agent, or Firm*—Luke Santangelo

[57] ABSTRACT

Method and apparatus for automatically testing an electrical coil through a surge tester. Comparison to a stored waveform through error area ratio computation is achieved by use of digital computer data processing techniques. A uniform threshold of acceptability is disclosed which is not dependent on voltage or type of coil tested. Statistical analysis may be programmed or hardwired into an embodiment to yield easily discernable manufacturing or field test information. Optimization of the entire process and the testing steps may also be achieved through an apparatus which may provide a variety of different output possibilities and which may be customized to the user's situation. Update and storage of test results is included as well as correlation with manufacturing data.

50 Claims, 6 Drawing Sheets

METHOD AND APPARATUS FOR AUTOMATICALLY CALCULATING THE INTEGRITY OF AN ELECTRICAL COIL

A. BACKGROUND OF THE INVENTION

Generally, the present invention relates to the field of surge test equipment. More specifically it relates to methods and apparatus to automatically determine the existence and extent of a fault in an electrical coil from a surge test.

The invention focuses on several needs of users of surge test equipment. These users include both manufacturers—who test their products before shipping—and users—who test their equipment in the field as part of maintenance procedures. From an understanding of both of these perspectives, the present invention addresses the needs of these persons and addresses limitations found in existing surge test equipment. One such need is the desire of those performing the test to rapidly ascertain the integrity of the item being tested. This is of particular concern in the surge test environment because production line testing may need to be accomplished very quickly. Another limitation of existing surge test apparatus is the inherent difficulty in accurately assessing the existence of a fault in the equipment being tested. Because traditional techniques often have been based upon a visual comparison of waveforms which are the reaction of the equipment to the surge, such visual comparison has been difficult to adapt for an automatic determination. This difficulty has perhaps been underscored by the fact that in spite of increasingly sophisticated analysis means becoming available, the vast majority of surge test equipment is still based on visual analysis by an operator. Since unacceptable fault levels in the equipment being tested are sometimes hard to detect visually, the operators would ideally have some degree of skill in analyzing the surge test response waveforms. This is inconsistent, however, with the need to have such waveforms reviewed in a highly repetitive fashion on an assembly line as frequently as every few seconds. Naturally such a method also introduces the possibility of human error and its associated limitations. While smaller and smaller tolerances have been demanded, the practical limitations inherent to a visual technique have been difficult to overcome. Although several efforts have been made to automate the determination of the existence of a fault in the equipment being tested, these efforts have met with varying degrees of success and have often proved not to provide as accurate a result as even the visual testing traditionally done. The present invention not only addresses each of these needs but several others.

Two of the additional aspects focused on in the present invention are particularly noteworthy. First, the nature of a surge test is such that the surge imposed upon the equipment to be tested actually weakens or, in extreme cases, can create a fault in that equipment. Although this aspect has been well known, traditional surge testing has not automatically limited the stress to which the equipment is subjected. In fact, through the existence of industry standards such as National Equipment Manufacturers Association Standard 1-12.05, repetitive surge testing has been widely supported. The present invention addresses this aspect by providing methods and test apparatus which automatically minimize the stress to which the equipment is subjected. Second, traditional surge testing has been through simultaneous comparison of the tested coil with a coil which is assumed to be acceptable—that is, a standard coil. In traditional techniques this usually has involved repeatedly subjecting the standard coil to identical surges as each different test item is analyzed. Not only does this weaken the standard coil but it is attended with other practical and power consumption concerns. Since the traditional technique of comparison testing is not an exact science, it has also been necessary to experimentally ascertain the threshold amount of change in the response to the surge at which a "fault" condition is determined to exist. This has been done through intentionally faulting an acceptable coil in the smallest possible way and observing the amount of change so induced. Obviously this technique has several undesirable features. The present invention addresses each of these aspects and the aforementioned aspects in one invention.

As background to surge testing in general, it should be understood that the technique of subjecting an electrical coil to a voltage surge is well known having been disclosed at least by 1943 in an article by C. M. Faust and N. Rohats entitled "Insulation Testing of Electrical Windings" (Trans. AIEE Vol. 62, pp. 203-06). Basically the technique involves subjecting an electrical coil, such as is frequently found in an electrical motor, to a sharp, high voltage pulse and then allowing this pulse to oscillate or "ring" within the coil. This ringing produces decaying oscillations which may vary in several ways if there is any fault within the winding. One such type of fault is a breakdown in the insulation between adjacent coils—a turn-to-turn fault. Such a fault would change the inductance and capacitance characteristics of the coil and would thus be seen in the resulting waveform. Of particular importance is the need to subject the coil to one or more high voltage pulses in order to detect an incipient fault in such insulation. The fact that small breakdowns may not be visible until several surges have been accomplished is one reason for using repetitive surges for testing. The basic techniques involved are well known and have been the subject of numerous inventive efforts. An example of the types of waveforms occurring for the various possible fault scenarios is contained in several articles by the assignee including: "Winding Fault Diagnosis by Surge Comparison" presented at the Fourteenth Electrical/Electronic Insulation Conference and "Surge Test Methods for Rotating Machines" as published by the IEEE.

While several inventive efforts have been directed to automating the technique of surge test analysis, most all of the automatic testers have been based upon the technique of comparing voltage levels of the test with those of a standard coil. Although envelope decay rate has also been used, it is almost always implemented in conjunction with voltage levels. The voltage level criterion has met with varying degrees of success and has not always resulted in more accurate determinations than were visually possible. U.S. Pat. No. 3,659,197 as assigned to General Electric Corporation presents an automatic testing device based on voltage comparisons which also allows visual analysis capabilities. That General Electric patent—through providing one technique for visual analysis and another technique for automatic analysis—also alludes to the inherent difficulties those skilled in the art have faced in attempting to develop a technique acceptable for automatic analysis. Another example of the prevalence of the use of voltage difference determinations as the criterion, is shown in U.S. Pat. No. 3,869,664 as assigned to Avtron Manufacturing, Inc., and its related patents. Although digital techniques have been available for some time, the focus by those skilled in the art on absolute voltage level criteria has become an impediment to the adaptation of automated techniques to the surge testing field. Even though absolute voltage criterion can be readily adapted to digital analysis, the potential for bad data points and its resulting in false indications has been undesirable.

Since the present invention, in its preferred embodiment, is based upon well known computer integration and sampling techniques, at first glance it would seem that those skilled in the art would have had no trouble implementing these techniques to their field. This would seem especially true because there has been a long-felt need for accurate and reliable and automatic assessment of surge test results. The limitation that those skilled in art faced was that they simply failed to realize that the problem lay in properly choosing the detection criterion. They did not appreciate that the voltage difference criterion was at the root of the problem. Although the variety of patents in the field of automatic surge test equipment and the broad range of dates of these inventive efforts show that substantial attempts were made to automate the equipment, the fact that the traditional technique of visually detecting a fault still remains as the preferred technique shows that those attempts did not fill the need of surge test users. They simply did not understand that the effort necessary in this regard was not in refinement of the systems involved but rather was in development of a proper detection criterion. The broad acceptance of a voltage difference criterion by those skilled in the art of producing automated surge test apparatus basically led by teachings away from the technical direction of the present invention. It is also noteworthy that it was even a surprise to the inventor that the development of an area-based analysis resulted in not only one standard which was consistent across a broad range of motor types and characteristics, but also that utilization of such a technique lent itself so well to the data analysis capabilities described herein.

The present invention recognizes and addresses each of these concerns and overcomes the limitations perceived by those skilled in the art by presenting methods and apparatus which, among other aspects, allow for digital processing and which overcome the difficulties in implementing such processing to the surge test field. The techniques and devices utilized in the present invention result in more accurate testing, in automatic testing and in testing which is more suitable from both the user's and manufacturer's perspectives.

B. SUMMARY OF THE INVENTION

Accordingly it is an object of the present invention to minimize the use of a standard coil in surge testing of equipment. Certainly an aspect of this goal is to avoid the need to impose a fault in an acceptable coil in order to determine the minimum threshold at which a coil is determined to contain a fault.

Another object of the present invention is to integrate a multipurpose, fully programmable computer into surge test techniques and equipment. An object of this is to present a system which allows sufficient variation in technique, programming and analyses to suit the particular user, the particular uses, and the varying application environments of surge test equipment.

It is also an object of the present invention to present methods through which acceptability of a coil may be determined without reference to a threshold dependent on a particular coil. In accordance with this purpose it is an object to provide the ability to generate a standard which does not directly depend on the results of any one coil tested. A further object of this general goal is to establish a threshold of acceptability which is consistent for the varying other types of coils tested, for varying voltages, or for varying other characteristics.

It is a further object of the present invention to provide methods and apparatus which allow more accurate surge testing of electrical coils. In this regard it is desired to overcome the limitations imposed by the visual techniques traditionally used in surge test determinations.

Broadly stated, a general object of the present invention is to automate the surge test process. In keeping with this general goal, it is an object of the present invention to achieve many objects through automatic means including: automatically assessing the acceptability of the coil being tested, automatically warning of changes in typical production variations for a variety of parameters, automatically stepping through several different tests at one point in both the manufacturing process and in the field testing, and automatically stopping subjecting the coil being tested to electrical surges upon detection of a fault.

Another broadly stated object of the present invention is to incorporate statistical analysis into the surge test process and to specifically incorporate such analysis into the surge test equipment. An object of this generally stated goal is to minimize and to optimize the number of times which a coil being tested must be subjected to a voltage surge. Another more specifically stated object of such statistical analysis is to optimize the process, levels, and standards which are utilized in determining the existence of a fault.

It is also an object of the present invention to present a method of analyzing the response of the coil being tested to a surge test. An object of this goal is to present a method which is accurate and suitable for digital applications. An object of the present invention is to introduce the use of area analysis to surge test operations.

Naturally further objects of the invention are disclosed throughout other areas of the specification and claims.

C. BRIEF DESCRIPTION OF DRAWINGS

FIG. 6b is a flow chart of the surge test subroutine which may be programmed to be performed as part of the flow chart shown in FIG. 6a.

D. DETAILED DESCRIPTION OF THE PREFERRED EMBODIMENT

Figure 1:
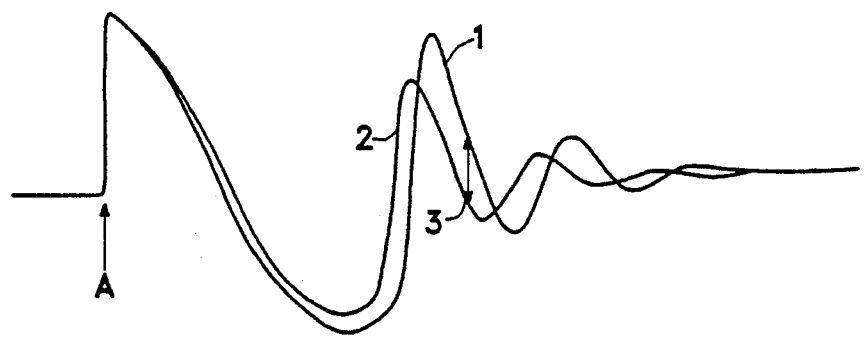
FIG. 1 is a graphic representation of a traditional simultaneous surge test of a standard coil and a faulted coil superimposing both responses on one plot.

As can be readily understood from the steps set forth in the claims, the basic concepts of the present invention may be embodied in many different ways. Although the field of surge testing is well understood, FIG. 1 shows a display encountered whenever the traditional technique of visually ascertaining the existence of a fault is utilized. Such a display would usually appear on a dual channel oscilloscope. Referring to FIG. 1, in which the vertical axis is voltage and the horizontal axis is time, the general technique of surge testing can be readily understood. At time A a voltage pulse is imposed on the coil being tested. This results in the rapid rise in the voltage displayed. After the pulse, which has a short rise time (typically about one microsecond), the voltage then begins to decay and effects a ringing within the coil. This ringing is characteristic of a specific combination of capacitance, inductance, and resistance in the coil being tested. As can be seen in FIG. 1, a standard waveform—that is the response to the pulse by an acceptable coil—results in a voltage response which is characteristic of that coil. Standard waveform (1) would of course vary whenever a different type of coil were used. This is the time-honored reason for comparing two simultaneous pulses and lead those skilled in the art to presuppose the need for coil-dependent thresholds. Superimposed on this waveform is a simultaneous waveform of a coil being tested. As can be seen, this test waveform (2) displays different characteristics—that is a different time dependency and different voltage levels. It is these differences which allow detection of faults in the coil being tested. The variation between the two is due to a difference in the combination of inductance, capacitance and resistance with respect to the two coils. This difference is due to a fault in the coil being tested. This faulr can be any number of types of faults as is well known to those accomplished at surge testing. An example would be a breakdown in the insulation between adjacent windings of the coil, a turn-to-turn insulation defect.

Figure 2:
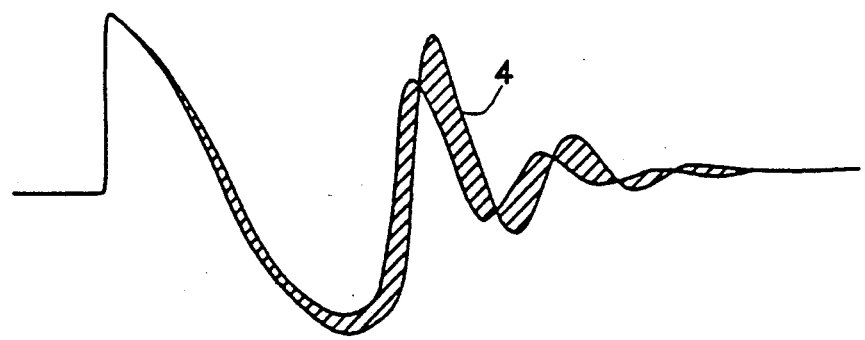
FIG. 2 is a graphic representation of responses not unlike those shown in FIG. 1 with the area which is the difference between the two response shaded.

Referring to FIG. 2, the technique of the present invention can be easily understood. While in the prior art the majority of automatic test equipment has easily utilized a voltage difference (3) at any point along the two plots, this traditional voltage difference criteria has limits as herein discussed. Rather than utilizing such an analysis technique, the present invention analyzes the area between standard waveform (1) and test waveform (2), shown as shaded area in FIG. 2. This error area (4) provides a more accurate measurement of the degree of fault contained in the test coil.

Figure 3:
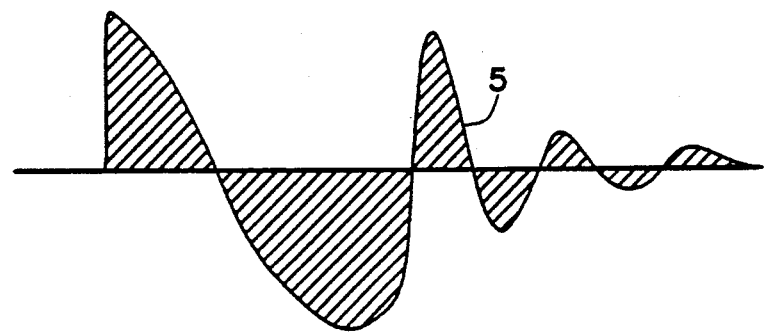
FIG. 3 is a graphic representation of a standard waveform with the area under a standard waveform shaded.

Referring to FIG. 3, it can be understood that a reference area (5) can be easily computed by measuring the area "under" standard waveform (1), shown as shaded area in FIG. 3. By "under" it is meant that the absolute value of the standard waveform would be utilized. A dimensionless ratio of error area (4) to reference area (5) can thus be easily computed. Since the technique of surge testing electrical coils is still being developed on a theoretical basis, it is true that prior to the present invention the use of traditional voltage difference criteria presented a practical expedient. However, voltage difference criterion has not been able to completely replace the visual detection techniques in many circumstances. In addition, it should be understood that other types of area analyses are possible and would fall within the scope and spirit of the present invention.

Figure 4:
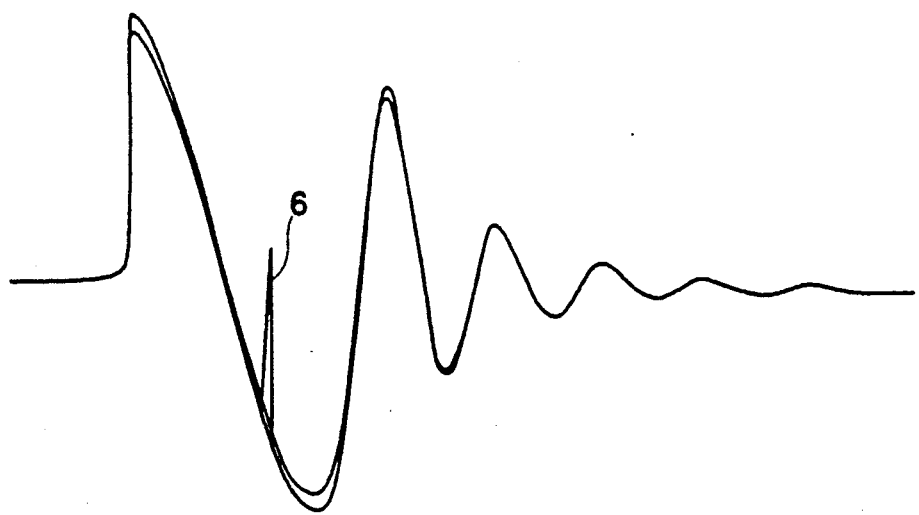
FIG. 4 is a graphic representation of the response of an acceptable test coil with an anomalous data point included.

Referring to FIG. 4, one example of the limitation of voltage differences as a detection criterion can be seen. FIG. 4 shows an acceptable test waveform in which one anomalous data point (6) is included. Anomalous data point (6) is intended to represent a bad data point which is not due to the coil itself but is rather due to noise or the like. Although the coil tested to produce the response shown in FIG. 4 should be acceptable, traditional voltage difference criteria would reject the coil due to the fact that anomalous data point (6) would exceed the set level of voltage difference determined to be acceptable when compared to standard waveform (1). Since visually an operator would question the test waveform shown in FIG. 4 and would conclude acceptability, and since tranditional voltage difference criteria would not lead to such a conclusion, automatic determination would be unacceptable in this case. The present invention avoids this difficulty through the use of area analysis. This is because anomalous data point (6) would result in only a small addition to error area (4). This small variation would not result in failure of the test by the coil.

Figure 5:
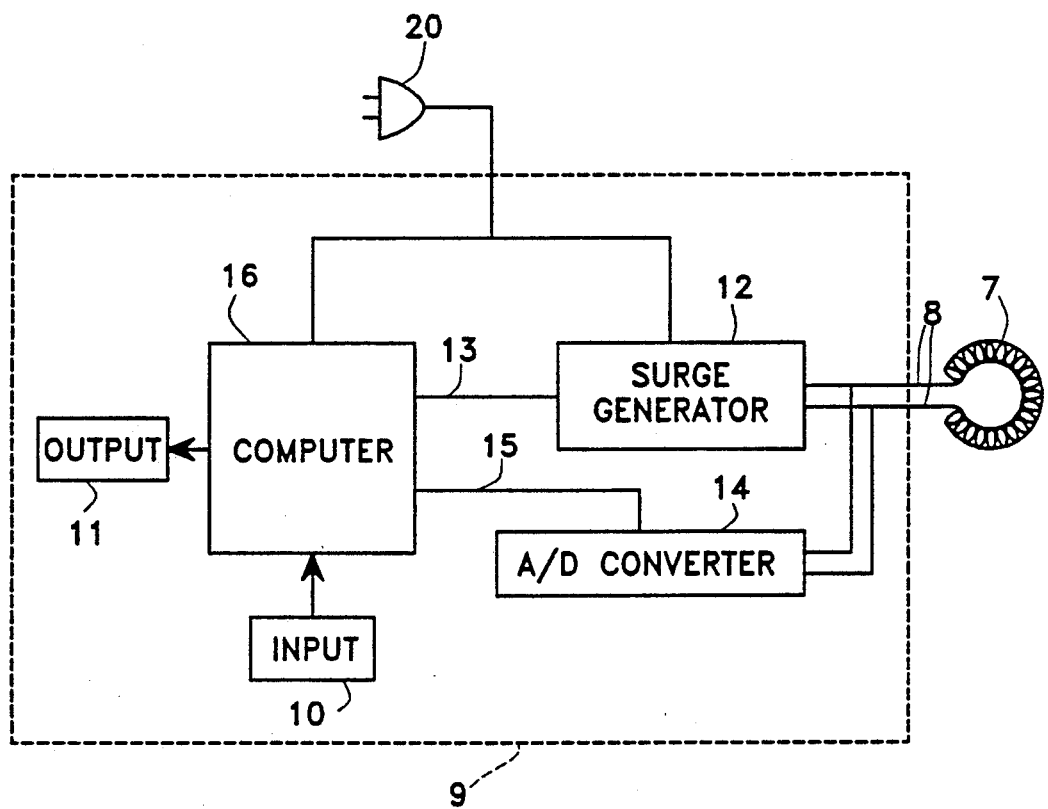
FIG. 5 is a block diagram of the preferred embodiment of the present invention.

FIG. 5 shows a block diagram of an apparatus designed to practice the present invention. Electrical coil (7) is connected for testing to the automated test apparatus (9) through leads (8). The coil (7) represents any type of coil wh ich is currently tested by surge test techniques such as a coil found in an electrical motor. These types of coils typically involve numerous windings of an electrical conductor separated by thin insulation. Leads (8) serve to allow connection of coil (7) to a surge generator (12) and to some sensing means. Surge generator (12) is basically a device as currently used by those skilled in the art of surge testing. It is designed to release a sharp voltage pulse into coil (7). This pulse then oscillates in a decaying fashion or "rings" within coil (7). This oscillation is characteristic of the integrity of the winding of the coil and thus can yield information to allow detection of a fault in a coil. While typical surge testers usually involve a sensing means and a display means, in FIG. 5 the sensing means and the display means are shown separate from surge generator (12). In addition, surge generator is designed and specifically configured to allow control through a computer (16). Interconnection between surge generator (12) and computer (16) may be accomplished through surge generator control line (13). Surge generator control line (13) may be either one or a series of electrical connections or may represent an optical interconnection. An optical connection would be useful specifically to aid in electrically isolating computer (16) from surge generator (12) as surge generator is designed to produce high voltage and operate in an electrical environment which could be detrimental to computer (16).

In order to sense the response of coil (7) to the voltage surge, a sensing means is used. As shown in FIG. 5, the sensor is basically analog-to-digital (A/D) converter (14). A/D converter (14) serves to transform the analog signal of the voltage response of coil (7) into a digital representation. A/D converter (14) then provides this information to computer (16) through digital transmission line (15). Again, digital transmission line

(15) may represent one or more electrical wires or may be accomplished through the use of optical interconnection. This would serve to isolate the high voltage response of coil (7) from computer (16) for the purposes described above. Since the response of coil (7) is relatively short-lived, sampling rate of A/D converter (14) must be sufficiently fast to permit adequate resolution in the digital representation of test waveform (2).

With respect to computer (16), it should be understood that a variety of configurations are possible. While the preferred embodiment utilizes a multipurpose, fully programmable computer such as an IBM XT compatible computer, certainly other computers or data analysis means are possible. Computer (16) might include a more specialized computer, might include a specifically-wired data processer, or might even be a permanently hardwired arrangement. The only essential aspects of computer (16) would be the ability to process the response of coil (7) to the surge in either an analog or digital fashion and to compare that response to a standard waveform. Since area analysis is a basic technique of othe preferred embodiment, computer (16) should also be capable of either summing to obtain the areas involved or integrating an analog signal. Each of these techniques would be readily available to those skilled in the art and could be accomplished without undue experimentation. Thus, both hardware, firmware, and software embodiments are intended to fall within the letter and spirit of the present invention.

Computer (16) may also include a digital processor such as a microprocesser chip, and both data and program memory. With respect to program memory, it is intended that the program would be stored in order to operate the automated test apparatus (9) in a variety of ways. Certainly the program contained in the program memory should be written to allow for not only the functions described, but also for easy variation by a user. Menu-driven software also would be highly desirable as the users many not be sophisticated computer programmers. The data memory used by computer (16) should be substantial enough to contain both a variety and considerable quantities of data. This is necessary because sufficient resolution on both standard waveform (1) and test waveform (2) may require a number of data points. These data points would be generated by a relatively fast A/D converter (14) as the pulse rises in less than a microsecond and the response of coil (7) lasts for no more than one second. In accordance with the statistical abilities of the present invention, it may also be highly desirable to allow for data smoothing and retention of the resultant waveforms for later use. As to the latter, the data memory may thus include not only a dynamic memory within computer (16) but also tape or disk memory for long term storage.

Computer (16) also incorporates an input component (10) and an output component (11). Each of these could represent a variety of techniques readily available. In the preferred embodiment input component (10) involves both a keyboard input and a bar code reader as is described below. Output component (11) would involve a cathode ray tube (CRT) display and a printer. Since manufacturing environments often involve one or more control computers, both input and output could involve some interface with another computer. Again, such variations are easily accomplished by those skilled in the art and thus fall within the letter and spirit of the present invention. It should be noted that output component (11) replaces the typical output utilized by many existing surge testers—a dual channel oscilloscope. Since such an oscilloscope represents a substantial portion of the cost and componentry of traditional surge testers, the separation of this component from surge generator (12) allows greater variability and potentially less cost. This would be specifically true of a hardwired embodiment of the present invention designed to accomplish a narrow purpose for one specific application in a manufacturing line. Certainly surge generator (12) and computer (16) need some power source (20). Although shown as a single source, power source (20) might actual be several sources, one for computer (16) and a separate one for surge generator (12). This separation of power source would assist in electrically isolating the various components.

Figure 6A:
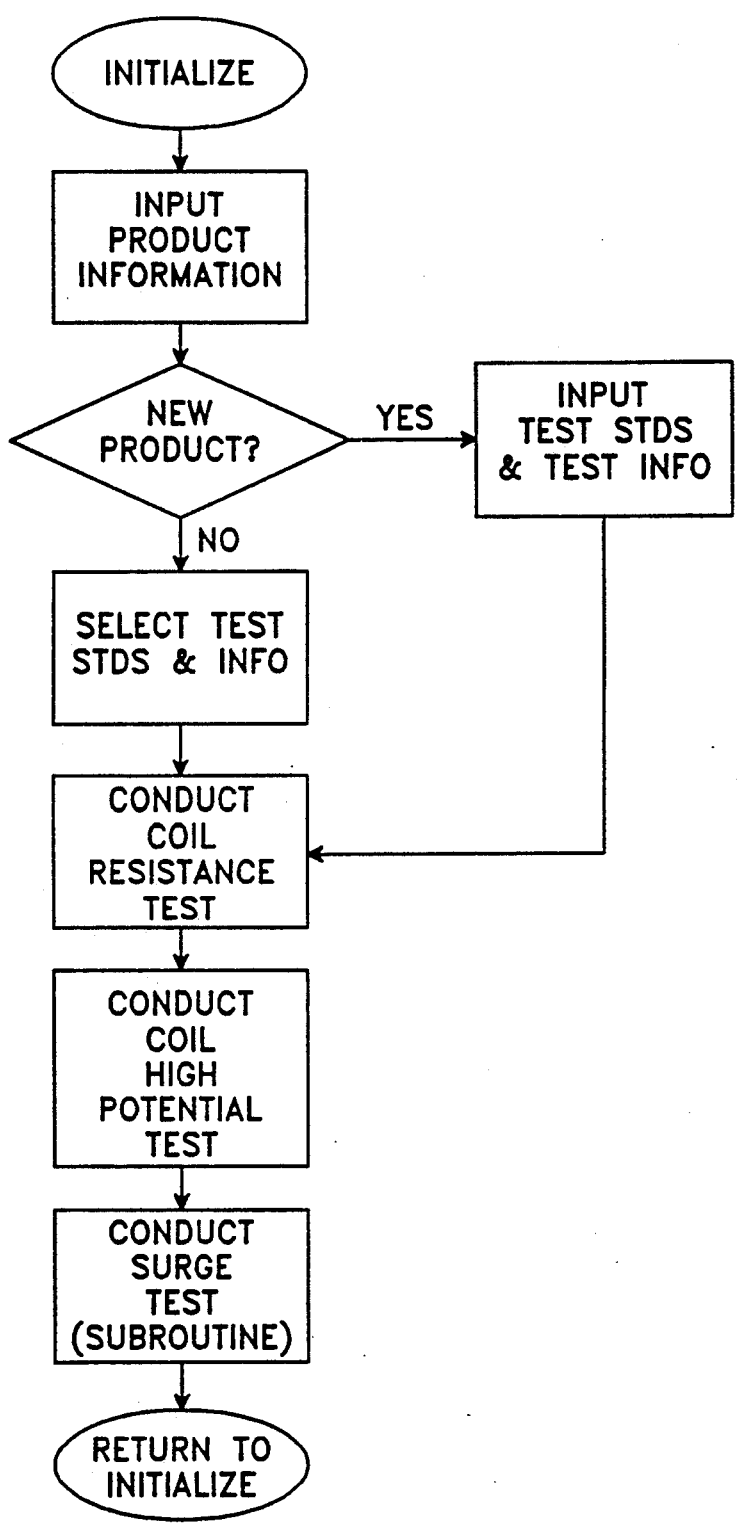
FIG. 6a is a flow chart of the overall steps which may be programmed to be performed by the embodiment shown in FIG. 5.
Figure 6B:
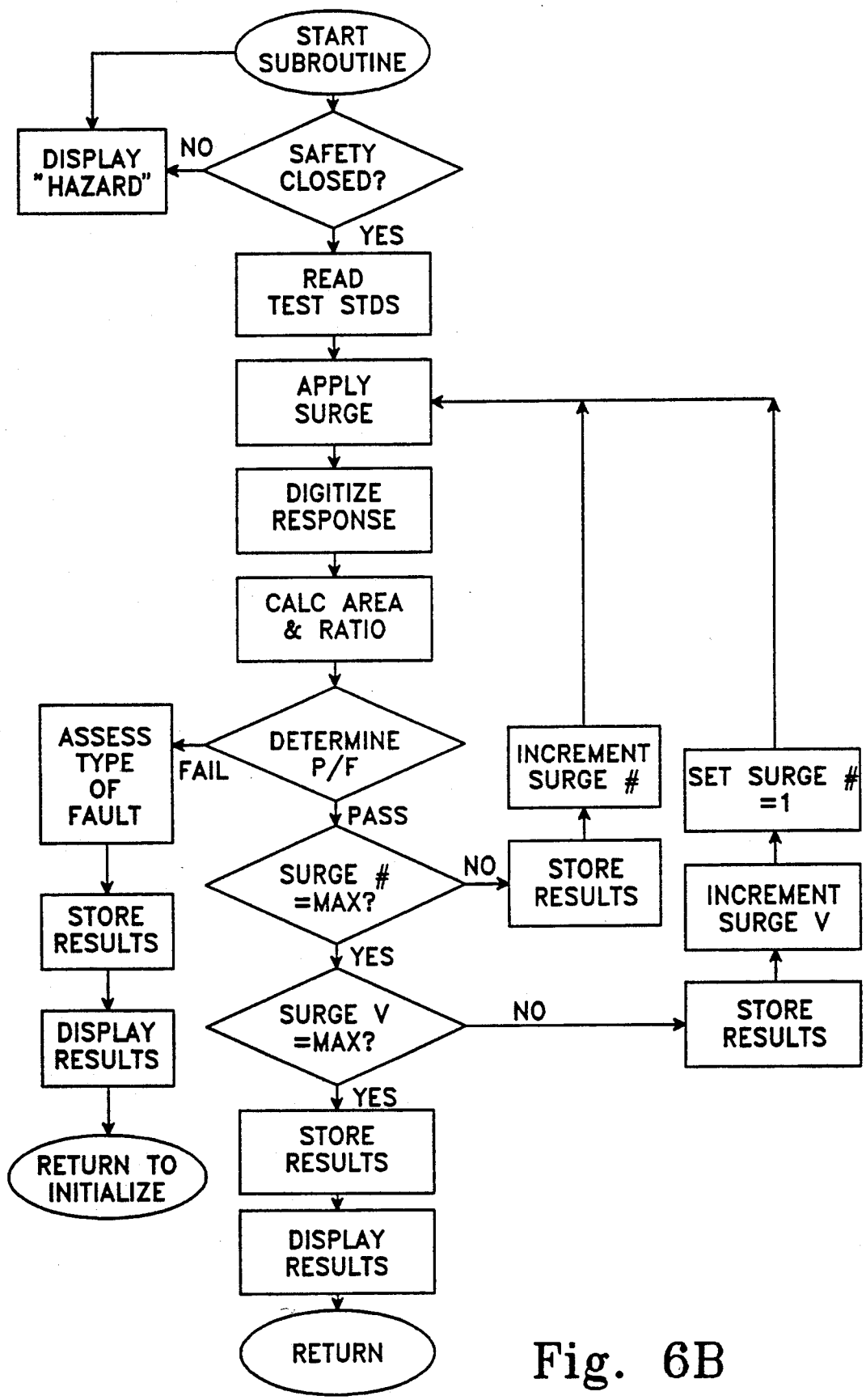

Referring to FIGS. 6a and 6b, it can be understood that computer (16) could be programmed to perform a variety of functions. Although the preferred embodiment shows general functions described in the flow charts of FIGS. 6a and 6b, a large variety of variation is possible. This is especially true when computer (16) represents a multi-purpose, fully programmable computer. In addition, due to the variety in types of computers of programmable data processors available, the specific steps representing the program may also vary widely. Since implementation of the functions shown in the flow chart could be readily accomplished by those skilled in the art, the specific programming sequences are not included. Those skilled in the art could make and use the present invention from the disclosure without undue experimentation. The programming could be readily accomplished once the methods herein are understood as the steps involved are the basis of implementation.

FIG. 6a represents the overall flow chart of the methods as they might be implemented through programming. As can be seen, several tests have been performed. Each of these tests may require subroutines as could be easily developed. The surge test subroutine is shown in FIG. 6b. With respect to FIG. 6a the step of inputting the appropriate test standards would include not only the proper parameters for each of the tests but also the proper standard waveform for comparison purposes. The input of such a waveform could be by recall from memory, through a statistical generation, or by actually conducting a test of an acceptable coil.

FIG. 6b is the subroutine for the surge test portion of the overall flow chart. As can be seen provision is made for counting the number of surges at any given voltage and for incrementing the voltage until a fault is detected. Through storing results after the completion of any test, the results are then available for statistical analysis as discussed later. Displays are provided throughout the flow chart and may be provided as appropriate to the particular output component (11). Certainly the display could include not only an indication to the operator, but also some type of printout which might accompany the failed coil so that those repairing it would have the benefit of the test results as well.

Figure 7:
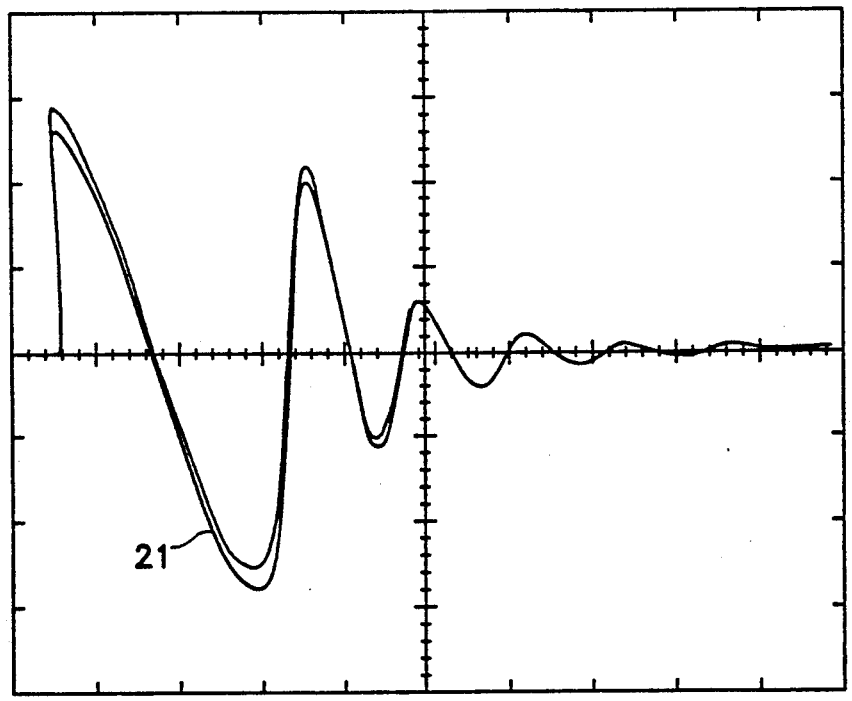
FIG. 7 is one possible output of the preferred embodiment of the present invention.

In the preferred embodiment output component (11) represents both a CRT display and a printer capable of producing a hardcopy. As an example, FIG. 7 shows the hardcopy output produced by an embodiment of the present invention. Although the variety of display possibilities may be limitless, the display shown in FIG. 7 contains many valuable features. The display shows the acceptance threshold (18). One of the unique—and perhaps surprising—features of the present invention is that it presents a technique in which acceptance threshold (18) is relatively independent of the type of coil, the level of voltage or the configuration involved. It has been found by the present inventor that the acceptance threshold (18) varies little for the current surge tests conducted. This is quite significant as it allows easy comparison across a variety of manufacturing lines, products and test conditions. While currently it is believed that an acceptance threshold of 10% represents an optimal acceptance threshold, it is believed that a range may be necessary when various configurations of automated test apparatus (9) are developed. As data sampling techniques are refined, it is believed that acceptance threshold (18) may be reduced to as low as 2%. Certainly in some applications the acceptance theshold (18) might be reduced even with existing sampling techniques. In addition, there may exist conditions where the acceptance threshold might be raised to as high as 25%. With slower sampling rates, reduced standards, analog integration, or other implementation aspects a broad range is thus necessitated. Certainly the threshold might even be set automatically based on statistical analysis of the data sampled.

The actual value of error area ratio (19) also allows determination of the type of fault present. It has been found that ratios ranging from 10% to 40% indicate a turn-to-turn fault; ratios ranging from 40% to 80% indicate either a coil-to-coil or a phase-to-phase fault; and ratios ranging from 80% and above indicate a ground fault or an open connection. In this fashion the techniques of the present invention allow automatic assessment of the type of fault existing. It should be understood that each of these ranges are only approximate and can include substantial overlap in some situations. Also the ranges unlike the base threshold, do vary with winding design, number of windings, and the like.

The display shown in FIG. 7 also shows an error area ratio (19). This represents the ratio of the error area (4) shown in FIG. 2 to the referenced area (5) shown in FIG. 3. As can be seen from the waveforms in FIG. 7, some variation is acceptable. Certainly the printout of FIG. 7 shows graphically that visual detection techniques are of limited accuracy as tighter tolerances are demanded. The present invention overcomes these limits thus paving the way for more accurate testing.

In addition, the display shown in FIG. 7 shows a final test determination (20). This final test determination represents either a "pass" or "fail" conclusion which may be made by comparison of error area ratio (19) to acceptance threshold (18). The display also shows a dual trace display (21) as a graphic indication of the test. Dual trace display (21) is identical to what would be shown by a dual channel oscilloscope as used in traditional techniques. It serves the added advantage of allowing quick confirmation to those accustomed to existing techniques and also shows the actual position of error area (4).

The techniques of the present invention also lend themselves to statistical analysis. By saving waveforms in digital form and by summarizing the variation of the test waveforms through area analysis, the integrity of the coil being tested can be automatically calculated. While there are many different techniques for automatic calculation, use of some type of area computation allows appropriate comparison of coils. Even more simply, the specific error area ratio for each coil can be easily analyzed. Although many different types of statistical analyses are possible, three different aspects are particularly noteworthy.

First, statistical analysis of failure data is possible. This would include comparisons of the percentage of failures, comparisons of different manufacturing batches, comparisons of different supplier lines, and comparisons of different production lines. For this reason product-specific manufacturing information may be incorporated in the methods described and represents a unique addition to the field of surge test equipment. Such information might include batch information, information with respect to the specific shift producing the coils, information with respect to the production line when more than one line produces the same coils, and the like. Product serial numbers or other identifying information might also be input. As a means of inputting such information, it may be useful to incorporate a bar code reader as part of input component (10). By having such information stored within computer (16), computer (16) could be programmed to automatically analyze and correlate the information. In the event of any deviation from acceptable standards, an automatic warning might be provided. Such would be extremely useful in instances where assembly line techniques are involved. In this fashion if any change were made in the assembly line which caused the rate of failure to exceed either a running average or a predetermined rate, managers might be immediately or even automatically notified. Also, slow decays in the manufacturing process might be sensed.

Another important aspect of these statistical analyses possible is the generation of the standard to which all coils are compared. As mentioned in the background of the invention, present techniques involve testing some coil which is assumed to be a standard, acceptable coil. This standard coil responds to the pulse by producing a standard waveform (1). Standard waveform (1) may either be reproduced simultaneously with test waveform (2) or may be recalled from memory for the comparison. Since there is some degree of variation in the responses of even acceptable coils, it may be useful to generate standard waveform (1). Such generation could be from a theoretical basis or more practically and as used in the preferred embodiment, may be stored from a test of a known, acceptable coil. This standard waveform (1) could then be updated through statistical techniques based upon tests of other acceptable coils. Certainly different weights could be ascribed to test waveforms as is well known for such statistical efforts. Naturally the standard waveform could be automatically updated each time a coil passes a test. Again, by use of digital techniques such methods could be accomplished without undue experimentation and so are not discussed in extreme detail. When such generation of a standard waveform is utilized, it would be possible to reassess the threshold levels at which the acceptability determination is made. Certainly, with respect to error area ratio (19), the threshold could be varied depending upon the size of sample utilized for the generated standard waveform or dependent upon the failure rate deemed acceptable by the manufacturer. As discussed earlier, one of the suprising results of the area calculation techniques is that the threshold is relatively independent of the type of coil involved, the voltages involved, or the frequencies inherent to the coils. Variations in the threshold may thus be accomplished independent of any tests of the particular coil involved. The considerable advantages of this were discussed earlier.

A third statistical technique is the possibility of optimizing the number of pulses to which the coil is subjected. As is known in the art of surge testing, an incipient fault is frequently not detectable by a single pulse alone. Rather, the prevalent technique of repetitive surge testing has developed. Although repetition of the surges is desirable for the detection of minor faults, repetition is also undesirable because it unduly stresses the insulation of good coils. By statistically analyzing the results of tests using more than one surge at a given voltage, the present invention could statistically determine the number of pulses necessary to reach the desired detection accuracy. The maximum number of pulses to any given voltage could also be set by the operator. Again, although those skilled in the art recognize the undesirability of unduly stressing the insulation of the windings of a coil, little effort has been made to automatically minimize the stresses. The facilitation of an area-based analysis makes implementation of this aspect straightforward.

Although the methods of the present invention are relatively self-explanatory to those skilled in the art, certain aspects are so significant that they deserve further explanation. As mentioned, a basic aspect of the present invention is the ability to conduct surge testing where a limit is set without testing a standard coil. This avoids the need to intentionally fault an otherwise-acceptable coil and also allows for easy comparison among different coil types. Without this aspect the statistical analysis mentioned earlier would be more involved. Another aspect is that a variety of standards might be utilized very easily. This is of particular importance when production line testing involves more than one coil such as when one motor has more than one type of coil. When the traditional technique (of comparison testing through a simultaneous test of a standard coil) was used, operators simply had to connect numerous coils to the test apparatus. In the present invention, only the type of coil needs to be entered, perhaps automatically through a bar code reader. The program controlling the equipment would then simply compare the result with the appropriate stored standard waveform. These methods also facilitate the use of multiple test channels or leads to conduct even faster testing.

Another aspect of the methods disclosed is the potential to step up the voltage of a test and stop as soon as a fault is detected. Since some applications may require different levels of acceptability and may subject the coils to different levels of stress, it may be useful to test a coil and to record the level at which a fault is first detected. While this level could also be analyzed statistically, it may allow groupings which are appropriate depending upon the ultimate uses of the coils. By not subjecting all coils to the highest level of voltage desired, the stress induced in such coils, especially those which display a fault early on, might be minimized.

Finally, it should be noted that the automated surge testing equipment proposed may also include automation of a variety of tests. As an example, resistance and high potential testing as are well known to those skilled in the art could also be incorporated. Through inclusion of the appropriate test apparatus and allowing such apparatus to be controlled by computer (16), automated test apparatus (9) might step through a variety of tests in sequence. It would be particularly efficient to combine surge testing with resistance and high potential testing because each of these three tests are possible at roughly the same point in a manufacturing process and because each are designed to yield information with respect to the acceptability of test coil (7). Even when coil (7) fails one of these tests, a surge test might still be completed to assist those in repairing coil (7). Naturally automation with respect to all of these tests may lend itself to more accurate testing. For instance a resistance test might be temperature-varied automatically to yield more accurate information. The simple inclusion of the multipurpose computer allows these new variations to be automatic.

I claim:

1. A method for automatically calculating the integrity of an electrical coil comprising the steps of sequentially:
    (a) connecting an electrical coil to test equipment;
    (b) subjecting said coil to at least one electrical surge;
    (b) subjecting said coil to at least one electrical surge;
    (c) reading the reaction of said coil to the electrical surge through operation of said test equipment;
    (d) automatically calculating the integrity of said coil; and
    (e) automatically determining the acceptability of the integrity by comparing said calculation of integrity to a limit wherein said limit is set without faulting a representative coil and wherein said limit is a dimensionless error representing a deviation from a resonance established by an impedance in the tester and an impedance of the coil.

2. A method for automatically calculating the integrity of an eletrical coil as described in claim 1 wherein said reaction is a test waveform and wherein said step of automatically calculating the integrity further comprises the steps of:
    (a) computing the area under a standard waveform;
    (b) comparing the test waveform to the standard waveform;
    (c) computing the area of the difference between said waveform and said standard waveform; and
    (d) ascertaining the ratio of said area of the difference to said area under the standard waveform.

3. A method for automatically calculating the integrity of an electrical coil as described in claim 2 and further comprising the step of automatically assessing the type of fault existing in an unacceptable coil.

4. A method for automatically calculating the integrity of an electrical coil as described in claim 3 wherein said step of automatically determining the acceptability comprises the step of comparing said ratio of said areas to a threshold value.

5. A method for automatically calculating the integrity of an electrical coil as described in claim 4 wherein said threshold value is from 0.02 to 0.25.

6. A method for automatically calculating the integrity of an electrical coil as described in claim 4 wherein said threshold value is 0.10.

7. A method for automatically calculating the integrity of an electrical coil as described in claim 6 wherein said step of automatically assessing the type os fault comprises the step of comparing the value of said ratio to a range of values.

8. A method for automatically calculating the integrity of an electrical coil as described in claim 7 and further comprising the steps of:
    (a) obtaining a standard waveform; and then
    (b) storing said standard waveform.

9. A method for automatically calculating the integrity of an electrical coil as described in claim 8 wherein the step of obtaining a standard waveform comprises the step of testing an acceptable coil.

10. A method for automatically calculating the integrity of an electrical coil as described in claim 9 wherein said step of subjecting said coil to at least one electrical surge comprises the step of automatically optimizing the number of surges to which said electrical coil is subjected at any given voltage.

11. A method for automatically calculating the integrity of an electrical coil as described in claim 8 wherein the step of obtaining a standard waveform comprises the step of generating said standard waveform.

12. A method of automatically calculating the integrity of an electrical coil as described in claim 11 wherein the step of generating said standard waveform comprises the steps of:
 (a) creating a sample of similar electrical coils; and then
 (b) statistically calculating the standard waveform.

13. A method for automatically calculating the integrity of an electrical coil as described in claim 12 wherein said step of generating a standard waveform further comprises the step of automatically updating said sample each time a similar coil is determined to be acceptable.

14. A method for automatically calculating the integrity of electrical coil as described in claim 13 wherein said threshold is dependent on the sample of similar electrical coils.

15. A method for automatically calculating the integrity of an electrical coil as described in claim 1, 3, or 9 wherein said surge is a voltage surge and wherein said step of subjecting said coil to at least one electrical surge comprises the steps of automatically:
 (a) subjecting the coil to at least one surge having a relatively low voltage; then
 (b) subjecting the coil to additional surges having increasingly higher voltages; and
 (c) stopping the surges at the lesser of either the lowest voltage at which a fault is detected, or a predetermined maximum voltage.

16. A method for automatically calculating the integrity of an electrical coil as described in claim 15 and further comprising the steps of:
 (a) inputting product-specific manufacturing information into the test equipment; and then,
 (b) automatically coordinating said information with the test results for that product.

17. A method for automatically calculating the integrity of an electrical coil as described in claim 16 wherein said step of inputting the product manufacturing information comprises the step of using a bar code reader.

18. A method for automatically calculating the integrity of an electrical coil as described in claim 16 and further comprising the step of statistically comparing said product manufacturing information and said test results.

19. A method for automatically calculating the integrity of an electrical coil as described in claim 18 and further comprising the step of automatically warning of any deviation in said test results from an acceptable failure rate.

20. A method for automatically calculating the integrity of an electrical coil as described in claim 19 and further comprising the step of automatically sequencing through more than one test.

21. A method for automatically calculating the integrity of an electrical coil as described in claim 20 wherein said step of automatically sequencing comprises the steps of:
 (a) performing a resistance test on said electrical coil; then
 (b) performing a high potential test on said electrical coil; and then
 (c) subjecting said coil to at least one electrical curge.

22. A method for automatically calculating the integrity of an electrical coil as described in claim 1, 3, or 9 and further comprising the step of automatically sequencing through more than one test.

23. A method for automatically calculating the integrity of an electrical coil comprising the steps of sequentially:
 (a) connecting an electrical coil to test equipment;
 (b) subjecting said coil to at least one electrical surge having a voltage level;
 (c) reading the reaction of said coil to the electrical surge through operation of said test equipment;
 (d) automatically calculating the integrity of said coil; and
 (e) automatically determining the acceptability of the integrity wherein said determination is independent of said voltage level.

24. A method for automatically calculating the integrity of an electrical coil as described in claim 23 wherein said reaction is a test waveform and wherein said test step of automatically calculating the integrity further comprises the steps of:
 (a) computing the area under a standard waveform;
 (b) comparing the test waveform to the standard waveform;
 (c) computing the area of the difference between said test waveform and said standard waveform; and
 (d) ascertaining the ratio of said area of the difference to said area under the standard waveform.

25. A method for automatically calculating the integrity of an electrical coil as described in claim 24 and further comprising the step of automatically assessing the type of fault existing in an unacceptable coil and wherein said step of automatically determining the acceptability comprises the step of comparing said ratio of said areas to a threshold value.

26. A method for automatically calculating the integrity of an electrical coil as described in claim 25 wherein said threshold value is 0.10, and wherein said step of automatically assessing the type of fault comprises the step of considering the value of said ratio.

27. A method for automatically calculating the integrity of an electrical coil as described in claim 24 and further comprising the step of automatically assessing the type of fault existing in an unacceptable coil.

28. A method for automatically calculating the integrity of an electrical coil as described in claim 23 or 21 wherein said surge is a voltage surge and wherein said step of subjecting said coil to at least one electrical surge comprises the steps of automatically:
 (a) subjecting the coil to at least one surge having a relatively low voltage; then
 (b) subjecting the coil to additional surges having increasingly higher voltages; and
 (c) stopping the surges at the lesser of either the lowest voltage at which a fault is detected, or a predetermined maximum voltage.

29. A method for automatically calculating the integrity of an electrical coil as described in claim 1 or 23 wherein said reaction is a test wavefrom and wherein said step of automatically calculating the integrity comprises the setp of making an area computation involving the test waveform.

30. A method for automatically calculating the integrity of an electrical coil as described in claim 1 or 23 and further comprising the step of automatically assessing the type of fault existing in an unacceptable coil.

31. An apparatus for automatically calculating the integrity of an electrical coil comprising:
   (a) a surge generator for subjecting said electrical coil to at least one electrical surge;
   (b) a means for sensing the response of the coil to said electrical surge;
   (c) a means for calculating the integrity of the coil; and
   (d) a means for determining the acceptability of the integrity by comparing said calculation of integrity to a limit wherein said limit is set without faulting a representative coil, and wherein said limit is a dimensionless error representing a deviation from a resonance established by an impedance in the tester and an impedance of the coil.

32. An apparatus for automatically calculating the integrity of an electrical coil as described in claim 31 wherein the response is a test waveform and wherein said means for calculating the integrity of the coil comprises a means for making an area computation involving said test waveform.

33. An apparatus for automatically calculating the integrity of an electrical coil as described in claim 32 wherein said means for sensing comprises an analog to a digital converter.

34. An apparatus for automatically calculating the integrity of an electrical coil as described in claim 31 wherein said means for calculating and said means for determining comprise a programmable means which further comprises a data processor.

35. An apparatus for automatically calculating the integrity of an electrical coil as described in claim 34 wherein said response is a test waveform and wherein said data processor is programmed to make an area computation involving the test waveform.

36. An apparatus for automatically calculating the integrity of an electrical coil as described in claim 35 wherein said data processor is programmed to:
   (a) compute the area under an acceptable response having a standard waveform;
   (b) compare the test waveform to the standard waveform;
   (c) compute the area of the difference between said test waveform and said standard waveform; and
   (d) ascertain the ratio of said area of the difference between said test waveform and said standard waveform to said area under said standard waveform.

37. An apparatus for automatically calculating the integrity of an electrical coil as described in claim 36 wherein said data processor is programmed to assess the type of fault existing in an unacceptable coil.

38. An apparatus for automatically calculating the integrity of an electrical coil as described in claim 37 wherein said data processor is programmed to compare said ratio of said areas to a threshold value.

39. An apparatus for automatically calculating the integrity of an electrical coil as described in claim 38 wherein said data processor is programmed to:
   (a) create a sample from tests of similar electrical coils; and then
   (b) statistically calculate the standard waveform.

40. An apparatus for automatically calculating the integrity of an electrical coil as described in claim 39 wherein said data processor is programmed to update said sample each time a similar coil is determined to be acceptable.

41. An apparatus for automatically calculating the integrity of an electrical coil as described in claim 38 or 40 wherein said data processor is programmed to optimize the number surges to which said electrical coil is subjected at any given voltage.

42. An apparatus for automatically calculating the integrity of an electrical coil as described in claim 41 wherein said data processor is programmed to:
   (a) accept the input of product-specific manufacturing information;
   (b) coordinate said information with the test results for that product; and
   (c) statistically compare said product manufacturing information and said test results.

43. A surge tester for determining the integrity of an electrical coil comprising;
   (a) an electrical surge generator;
   (b) a multi-purpose, fully programmable computer;
   (c) a means for sensing the response of the coil to said electrical surge, wherein said means for sensing comprises an analog to digital converter and wherein said fully programmable computer comprises:
      (i) a digital processor;
      (ii) a data memory;
      (iii) a program memory;
      (iv) a means for displaying output of said computer;
      (v) an input component for entering and revising the program memory by the user of the surge tester; and
      (vi) an output component; and
   (d) wherein said response is a test wave form and wherein said program memory controls said digital processor to make an area computation involving the test wave form.

44. A surge tester for determining the integrity of an electrical coil as described in claim 43 wherein said program memory controls said digital processor to:
   (a) compute the area under an acceptable response having a standard waveform;
   (b) compare the test waveform to the standard waveform; and
   (c) ascertain the ratio of said area of the difference to said area under the standard waveform.

45. A surge tester for determining the integrity of an electrical coil as described in claim 44 wherein said program memory controls said digital processor to assess the type of fault existing in an unacceptable coil.

46. A surge tester for determining the integrity of an electrical coil as described in claim 45 wherein said program memory controls said digital processor to compare said ratio of said areas to a threshold value.

47. A surge tester for determining the integrity of an electrical coil as described in claim 46 wherein said program memory controls said digital processor to:
   (a) create a sample from tests of similar electrical coils; and then
   (b) statistically calculate the standard waveform.

48. A surge testor for determining the integrity of an electrical coil as described in claim 47 wherein said program memory controls said digital processor to update said sample each time a similar coil is determined to be acceptable.

49. A surge tester for determining the integrity of an electrical coil as described in claim 43 of 48 wherein said program memory controls said digital processor to optimize the number of surges to which said electrical coil is subjected at any given voltage.

50. A surge tester for determining the integrity of an electrical coil as described in claim 49 wherein said program memory controls said digital processor to:
(a) accept the input of product-specific manufacturing information;
(b) coordinate said information with the test results for that product; and
(c) statistically compare said product manufacturing information and said test results.

* * * * *